US012706165B2

(12) United States Patent
Zhang et al.

(10) Patent No.: US 12,706,165 B2
(45) Date of Patent: Aug. 11, 2026

(54) MEMORIES, OPERATION METHODS OF MEMORIES, AND MEMORY SYSTEMS

(71) Applicant: YANGTZE MEMORY TECHNOLOGIES CO., LTD., Wuhan (CN)

(72) Inventors: Yang Zhang, Wuhan (CN); Yan Wang, Wuhan (CN); Jing Wei, Wuhan (CN); Masao Kuriyama, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/631,447

(22) Filed: Apr. 10, 2024

(65) Prior Publication Data

US 2025/0174287 A1 May 29, 2025

(30) Foreign Application Priority Data

Nov. 28, 2023 (CN) ......................... 202311624992.0

(51) Int. Cl.

*G06F 12/00* (2006.01)
*G06F 12/02* (2006.01)
*G11C 16/04* (2006.01)
*G11C 16/08* (2006.01)
*G11C 16/10* (2006.01)
*G11C 16/34* (2006.01)

(52) U.S. Cl.

CPC ...... *G11C 16/3459* (2013.01); *G06F 12/0246* (2013.01); *G11C 16/0483* (2013.01); *G11C 16/08* (2013.01); *G11C 16/10* (2013.01)

(58) Field of Classification Search

CPC . G11C 16/3459; G11C 16/0483; G11C 16/08; G11C 16/10; G06F 12/0246
USPC .......................................................... 711/103
See application file for complete search history.

(56) References Cited

U.S. PATENT DOCUMENTS

2005/0056869 A1* 3/2005 Ichige .................... H10B 43/30 257/E21.679
2009/0175087 A1* 7/2009 Park ................... G11C 16/3454 365/185.25
2012/0155186 A1* 6/2012 Chokan ............. G11C 16/3459 365/185.22

* cited by examiner

*Primary Examiner* — Mardochee Chery
(74) *Attorney, Agent, or Firm* — Conley Rose, P.C.

(57) ABSTRACT

The present disclosure provides memories, operation methods of memories, and memory systems. An example memory includes: a memory cell array, word lines, a first select line, and a peripheral circuit. The peripheral circuit is configured to: in a first period of a recovery period of a verify operation, apply a first voltage to a first word line, and apply a second voltage to a second word line, wherein the second voltage is greater than the first voltage; in a second period of the recovery period of the verify operation, apply a third voltage to the first select line; and in a third period of the recovery period of the verify operation, apply a fourth voltage to the first word line, and apply a fifth voltage to the second word line, wherein the fifth voltage is greater than the fourth voltage.

20 Claims, 9 Drawing Sheets

MEMORIES, OPERATION METHODS OF MEMORIES, AND MEMORY SYSTEMS

CROSS-REFERENCE TO RELATED APPLICATIONS

The present application claims priority to Chinese Patent Application No. 202311624992.0, which was filed Nov. 28, 2023, is titled "Memory, Memory Operating Method And Memory System," and is hereby incorporated herein by reference in its entirety.

TECHNICAL FIELD

The present disclosure relates to the technical field of memories, and particularly to memories, operation methods of memories, and memory systems.

BACKGROUND

A NAND flash is a memory capable of holding data stored thereby for a long time without being energized, and has advantages such as a low storage cost and a high storage capacity, etc. During execution of a program operation, the NAND flash programs memory cells in pages, so as to store data into the memory cells.

SUMMARY

Examples of the present disclosure provide a memory, an operation method of a memory, and a memory system.

The examples of the present disclosure employ the following technical solution:

In a first aspect, examples of the present disclosure provide a memory, which comprises: a memory cell array comprising a plurality of memory strings, each comprising a first select transistor, a plurality of memory cells, and a second select transistor sequentially connected in series; a plurality of word lines coupled to the plurality of memory cells; and a peripheral circuit coupled to the plurality of word lines and the first select line, and configured to: in a first period of a recovery period of a verify operation, apply a first voltage to a first word line, and apply a second voltage to a second word line, wherein the second voltage is greater than the first voltage; and in a second period of the recovery period of the verify operation, apply a third voltage to the first select line.

In some examples, the peripheral circuit is further configured to: in a third period of the recovery period of the verify operation, apply a fourth voltage to the first word line, and apply a fifth voltage to the second word line, wherein the fifth voltage is greater than the fourth voltage.

In some examples, the memory further comprises a second select line coupled to the second select transistor. The peripheral circuit is further configured to: in the second period of the recovery period of the verify operation, apply the fourth voltage to the second select line.

In some examples, the peripheral circuit is further configured to: after the second period of the recovery period of the verify operation, apply a sixth voltage to the first select line, wherein the sixth voltage is less than the third voltage.

In some examples, the peripheral circuit is further configured to: in a fourth period of the recovery period of the verify operation, apply the fourth voltage to the first select line.

In some examples, the peripheral circuit is further configured to: in a fifth period of the recovery period of the verify operation, apply a program voltage to the second word line, and apply a pass voltage to the first word line.

In some examples, the peripheral circuit is further configured to: in the first period of the recovery period of the verify operation, apply a fourth voltage to a third word line, wherein the third word line is located between the second word line and the first select line. That is, the fourth voltage may be applied to an unprogrammed memory cell, so as to cause the unprogrammed memory cell to be in the on state.

In some examples, a memory cell coupled with the first word line is a programmed memory cell, and a memory cell coupled with the third word line is an unprogrammed memory cell.

In some examples, the peripheral circuit is further configured to: in the second period of the recovery period of the verify operation, apply a seventh voltage to a source line, wherein the first select line is located between the third word line and the source line.

In some examples, the peripheral circuit is further configured to: in the second period of the recovery period of the verify operation, apply an eighth voltage to a bit line, wherein the first select line is located between the third word line and the bit line.

In some examples, the peripheral circuit is further configured to: in the first period of the recovery period of the verify operation, apply the second voltage to a fourth word line, wherein the fourth word line is located between the second word line and the first word line.

In some examples, the peripheral circuit is further configured to: in the first period of the recovery period of the verify operation, apply a fourth voltage to a fifth word line, wherein the fifth word line is located between the first word line and the second select line.

In some examples, the peripheral circuit is further configured to: in a first period of a recovery period of a last verify operation on the memory string, apply a ninth voltage to the first word line and the second word line.

In some examples, the second voltage is less than a pass voltage.

In a second aspect, examples of the present disclosure provide an operation method of a memory, which comprises: in a first period of a recovery period of a verify operation, apply a first voltage to a first word line, and apply a second voltage to a second word line, wherein the second voltage is greater than the first voltage; and in a second period of the recovery period of the verify operation, applying a third voltage to a first select line.

In some examples, the method further comprises: in a third period of the recovery period of the verify operation, applying a fourth voltage to the first word line, and applying a fifth voltage to the second word line, wherein the fifth voltage is greater than the fourth voltage.

In some examples, the method further comprises: in the second period of the recovery period of the verify operation, applying a fourth voltage to a second select line.

In some examples, the method further comprises: after the second period of the recovery period of the verify operation, applying a sixth voltage to the first select line, wherein the sixth voltage is less than the third voltage.

In some examples, the method further comprises: in a fourth period of the recovery period of the verify operation, applying the fourth voltage to the first select line.

In some examples, the method further comprises: in a fifth period of the recovery period of the verify operation, applying a program voltage to the second word line, and applying a pass voltage to the first word line.

In some examples, the method further comprises: in the first period of the recovery period of the verify operation, applying a fourth voltage to a third word line, wherein the third word line is located between the second word line and the first select line.

In some examples, a memory cell coupled with the first word line is a programmed memory cell, and a memory cell coupled with the third word line is an unprogrammed memory cell.

In some examples, the method further comprises: in the second period of the recovery period of the verify operation, applying a seventh voltage to a source line, wherein the first select line is located between the third word line and the source line.

In some examples, the method further comprises: in the second period of the recovery period of the verify operation, applying an eighth voltage to a bit line, wherein the first select line is located between the third word line and the bit line.

In some examples, the method further comprises: in the first period of the recovery period of the verify operation, applying the second voltage to a fourth word line, wherein the fourth word line is located between the second word line and the first word line.

In some examples, the method further comprises: in the first period of the recovery period of the verify operation, applying a fourth voltage to a fifth word line, wherein the fifth word line is located between the first word line and the second select line.

In some examples, the method further comprises: in a first period of a recovery period of a last verify operation on the memory string, applying a ninth voltage to the first word line and the second word line.

In some examples, the second voltage is less than a pass voltage.

In a third aspect, a memory system is provided, which comprises: the memory of the first aspect, and a memory controller coupled to the memory and configured to control the memory.

In a fourth aspect, an electronic apparatus is provided, which comprises the memory system described above.

BRIEF DESCRIPTION OF THE DRAWINGS

In order to illustrate the technical solution in the present disclosure more clearly, the drawings to be used in some examples of the present disclosure will be briefly introduced below. Apparently, the drawings in the following description are only drawings of some examples of the present disclosure. Those of ordinary skills in the art may also obtain other drawings according to these drawings. Furthermore, the drawings in the following description may be regarded as schematic diagrams, instead of limiting an actual size of a product, an actual flow of a method, and an actual timing of a signal, etc. involved in the examples of the present disclosure.

DETAILED DESCRIPTION

Figure 1:
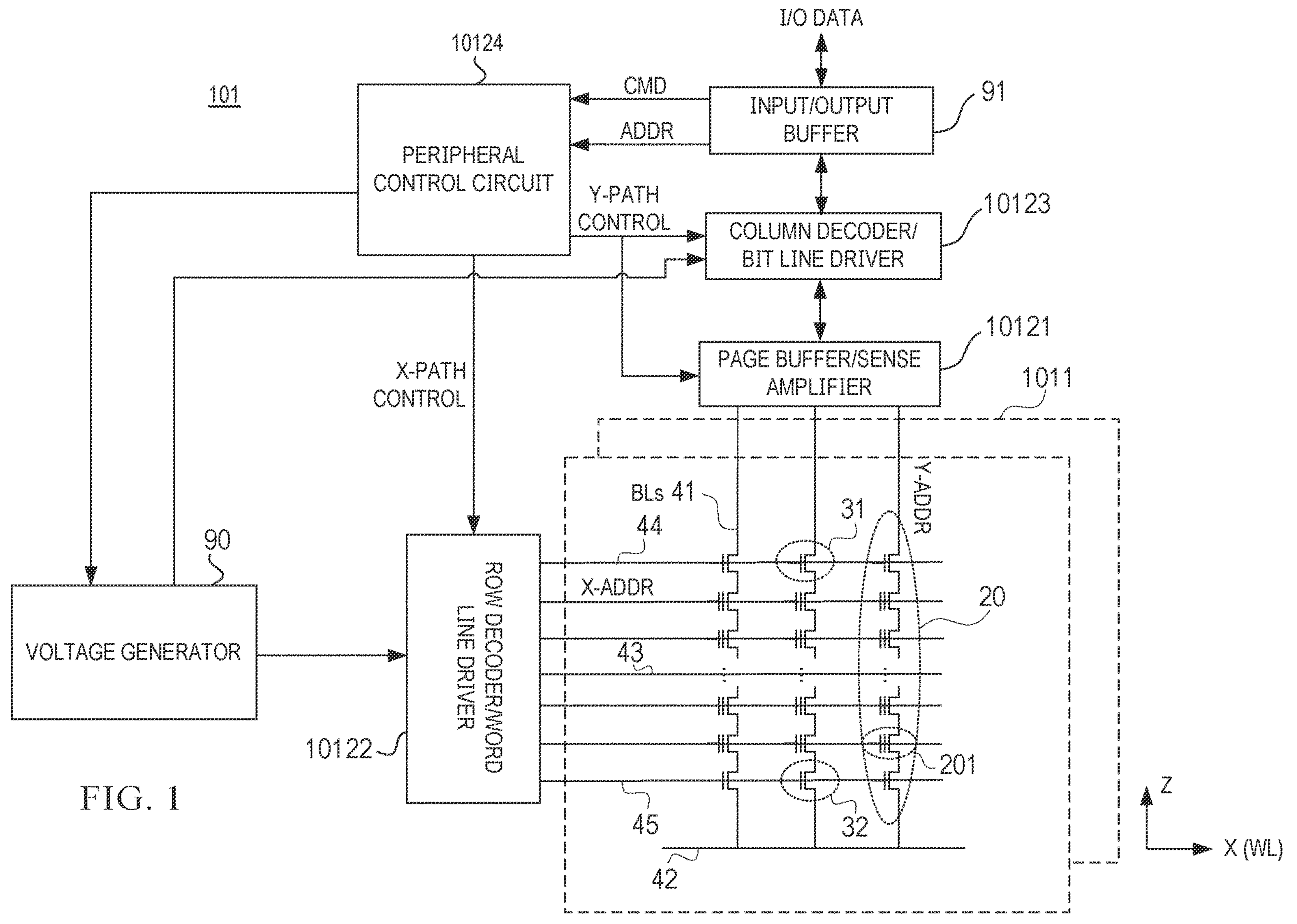
FIG. 1 is a schematic structural diagram of a memory 101 provided by examples of the present disclosure.

The technical solutions in some examples of the present disclosure will be described below clearly and completely in conjunction with the drawings. Apparently, the examples described are only part of, but not all of, the examples of the present disclosure. All other examples obtained by those of ordinary skills in the field based on the examples provided by the present disclosure shall fall in the scope of protection of the present disclosure.

In the description of the present disclosure, the terms "center", "upper", "lower", "front", "rear", "left", "right", "vertical", "horizontal", "top", "bottom", "inner", and "outer", etc. indicate orientational or positional relationships that are based on the orientational or positional relationships as shown in the drawings, and are only intended to facilitate description of the present disclosure and to simplify the description, instead of indicating or implying that a device or an element indicated must have a specific orientation or be constructed and operated in a specific orientation, and thus cannot be understood as limiting the present disclosure.

Unless otherwise specified in the context, throughout the specification and the claims, the term "comprise" is interpreted as an open and inclusive meaning, i.e., "including, but not limited to". In the description of the specification, the terms "one implementation", "some implementations", "example implementation", "in an example", or "some examples" indicate that particular features, structures, materials, or characteristics related to the implementation or example are included in at least one implementation or example of the present disclosure. The schematic representation of the above terms may not necessarily refer to the same implementation or example. Furthermore, these features, structures, materials, or characteristics may be included in one or more examples in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of the examples of the present disclosure, "a plurality of" means two or more, unless otherwise stated. "At least one of A, B and C" and "at least one of A, B or C" have the same meaning, both including the following combinations of A, B and C: A alone, B along, C alone, a combination of A and B, a combination of A and C, a combination of B and C, and a combination of A, B and C. "A and/or B" includes the following three combinations: A alone, B alone, and a combination of A and B.

The use of "adapted to" or "configured to" herein means an open and inclusive language, and does not exclude an apparatus adapted to or configured to perform additional tasks or operations.

The term "three-dimensional memory" refers to a semiconductor device formed by memory cell transistor strings (referred to as "memory cell strings" or "memory strings" herein, such as NAND memory cell strings) that are arranged in an array on a main surface of a substrate or a source layer and extend along a direction perpendicular to the substrate or the source layer. As used herein, the term "vertical/vertically" means being nominally perpendicular to the main surface (i.e., a transverse surface) of the substrate or the source layer.

As described above, a NAND flash is a memory capable of holding data stored thereby for a long time without being energized, and has advantages such as a low storage cost and a high storage capacity, etc. During execution of a program operation, the NAND flash programs memory cells in pages, so as to store data into the memory cells. However, during the execution of the program operation, the NAND flash is prone to program disturbance. The implementations described herein reduce the program disturbance.

As shown in FIG. 1, FIG. 1 is a schematic structural diagram of a memory 101 provided by examples of the present disclosure. The memory 101 comprises one or more memory blocks 1011. Each memory block 1011 comprises a plurality of memory strings 20. Each memory string 20 comprises a top select transistor (top select gate, TSG) 31, a plurality of memory cells 201, and a bottom select transistor (bottom select gate, BSG) 32 connected in series. A drain terminal of the top select transistor 31 may be connected to a bit line 41, and a source terminal of the bottom select transistor 32 may be connected to an array common source (ACS). The array common source may be shared by the memory strings 20 in the entire memory block 1011, and is also referred to as a source line (SL) 42. Each memory cell 201 may be connected to a corresponding word line (WL) 43, the top select transistor 31 may be connected to an upper select line 44, and the bottom select transistor 32 may be connected to a lower select line 45.

In some examples, the memory 101 further comprises a peripheral circuit, and the peripheral circuit may be coupled with the word line 43, the bit line 41, the source line 42, the upper select line 44, and the lower select line 45, etc. The peripheral circuit may comprise a page buffer/sense amplifier 10121, a row decoder/word line driver 10122, a column decoder/bit line driver 10123, and a peripheral control circuit 10124. The memory block 1011 may be coupled with the row decoder/word line driver 10122 via the word line 43, the top select transistor 31, and the bottom select transistor 32. The memory block 1011 may be coupled with the page buffer/sense amplifier 10121 via the bit line 41. The row decoder/word line driver 10122 may select one of the memory blocks 1011 on the memory 101 in response to an X-path control signal provided by the peripheral control circuit 10124. The row decoder/word line driver 10122 may transfer a voltage provided from a voltage generator 90 to the word line 43 according to the X-path control signal. During read and program operations, the row decoder/word line driver 10122 may transfer a read voltage Vread and a program voltage Vpgm to a select word line 43 and transfer a pass voltage Vpass to an unselect word line according to the X-path control signal received from the peripheral control circuit 10124.

A column decoder/bit line driver 10123 may transfer an inhibit voltage Vinhibit provided by the voltage generator 90 to an unselect bit line and ground the select bit line 41 according to a Y-path control signal received from the peripheral control circuit 10124. That is, the column decoder/bit line driver 10123 may be configured to select or unselect one or more memory strings 20 according to the Y-path control signal from peripheral control circuit 10124. The page buffer/sense amplifier 10121 may be configured to read and program (write) data from and to the memory block 1011 according to the Y-path control signal from peripheral control circuit 10124. For example, the page buffer/sense amplifier 10121 may store a page of data to be programmed into a memory page. In another example, the page buffer/sense amplifier 10121 may perform a verify operation to ensure that data has been properly programmed to each memory cell 201. In yet another example, during a read operation, the page buffer/sense amplifier 10121 may sense: a current that flows through the bit line 41 and reflects a logic state (i.e., data) of the memory cell 201; and an amplification ratio for amplifying a small signal to a measurable signal.

An input/output buffer 91 may transfer I/O data to/from the page buffer/sense amplifier 10121, and transfer an address ADDR signal or a command CMD signal to the peripheral control circuit 10124. In some examples, the input/output buffer 91 may serve as an interface between a memory controller and the memory 101.

The peripheral control circuit 10124 may control the page buffer/sense amplifier 10121 and the row decoder/word line driver 10122 in response to a command CMD transferred by the input/output buffer 91. During a program operation, the peripheral control circuit 10124 may control the row decoder/word line driver 10122 and the page buffer/sense amplifier 10121 to program the select memory cell 201. During a read operation, the peripheral control circuit 10124 may control the row decoder/word line driver 10122 and the page buffer/sense amplifier 10121 to read the select memory cell 201. The X-path control signal comprises a row address X-ADDR, and the Y-path control signal comprises a column address Y-ADDR, both of which may be used to locate the select memory cell 201 in the memory block 1011. The row address X-ADDR may comprise a page index, a block index, and a plane index, so as to identify a memory page and a memory block 1011 respectively. The column address Y-ADDR may identify a byte or a word in data of the memory page.

In some examples, the peripheral control circuit 10124 may comprise one or more control logic units. Each control logic unit described herein may include at least one of a software module or a firmware module running on a processor, for example, a microcontroller unit (MCU) serving a as part of the peripheral control circuit 10124, or a hardware module of a finite-state machine (FSM), e.g., an integrated circuit (IC), such as an application-specific IC (ASIC) and a field-programmable gate array (FPGA) etc., or a combination of the software module, the firmware module, and the hardware module.

The voltage generator 90 may generate voltages provided to the word line 43 and the bit line 41 under the control of the peripheral control circuit 10124. The voltages generated by the voltage generator 90 include the read voltage Vread, the program voltage Vpgm, the pass voltage Vpass, and the inhibit voltage Vinhibit, etc.

In some examples, the memory 101 may be formed based on a floating gate technology. In some examples, the memory 101 may be formed based on a charge trapping technology. The charge trapping-based memory 101 can provide a high storage density and high intrinsic reliability. The stored data or logic state (for example, a threshold voltage Vth of the memory cell 201) depends on an amount of charge trapped in a memory layer. In some examples, the memory 101 may be a three-dimensional (3D) memory apparatus in which the memory cells 201 may be vertically stacked on top of each other.

Currently, after each program pulse and verify pulse in the program operation ends, voltages on all word lines are recovered to VDD, and voltages on the top select transistor and the bottom select transistor are recovered to VSS.

Figure 2:
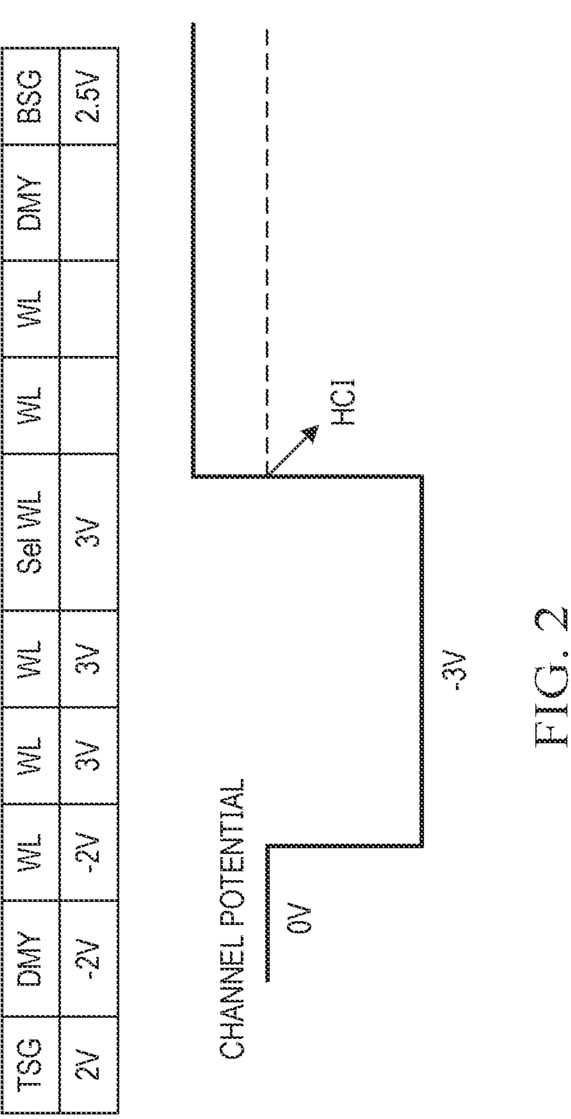
FIG. 2 is a schematic diagram of a hot carrier injection effect provided by examples of the present disclosure.

As shown in FIG. 2, FIG. 2 is a schematic diagram of a hot carrier injection effect provided by examples of the present disclosure. A 2 V voltage is applied to the upper select line coupled with the top select transistor, a −2 V voltage is applied to a word line coupled with a dummy layer (DMY), −2 V voltage is applied to an unselect word line away from a select word line, a 3 V voltage is applied to an unselect word line close to the select word line, a 3 V voltage is applied to the select word line (sel wl), and a 2.5 V voltage is applied to the lower select line coupled with the bottom select transistor. When the verify operation ends, during recovery of a word line voltage to VDD, a select string programmed cell is off prematurely due to a high threshold voltage thereof. At this time, a potential of a channel may be down coupled from 0 V to a negative voltage, e.g., −3 V. At this time, if the potential of the down-coupled channel is not reset, the subsequent program operation produces a hot carrier injection (HCI) effect when the potential of the channel rises, and there are residual electrons in the channel, thus causing program disturbance.

Figure 3:
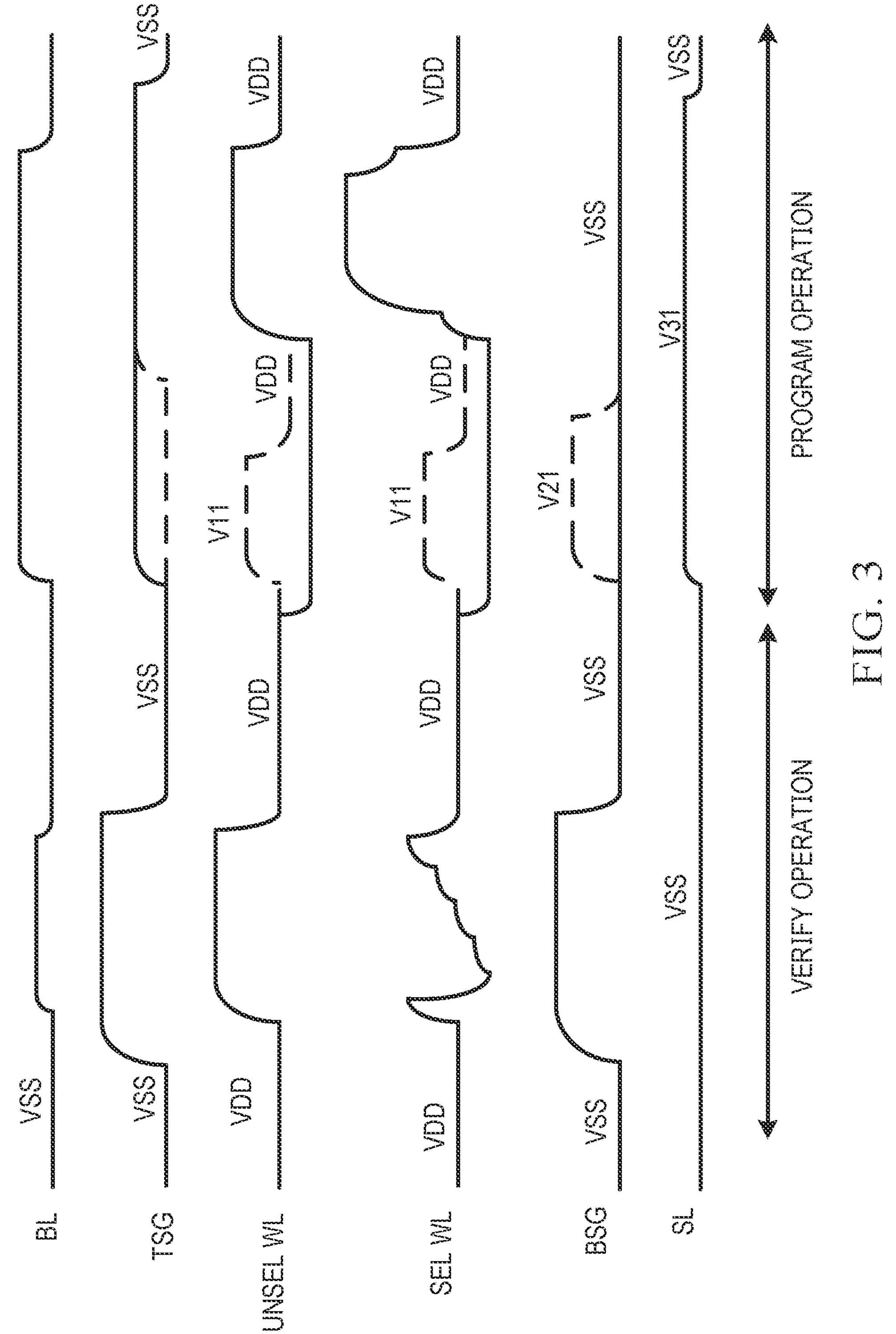
FIG. 3 is a timing diagram of application of an unselect string boosting enhancement method provided by examples of the present disclosure.

Currently, an unselect string boosting enhancement (USBE) method is proposed to reduce the impact of a recovery period of the verify operation on the program operation. As shown in FIG. 3, FIG. 3 is a timing diagram of application of the unselect string boosting enhancement method provided by examples of the present application. FIG. 3 illustrates one verify operation and one program operation, and a dashed line part in FIG. 3 is the timing diagram of the application of the unselect string boosting enhancement method. In an example, in a preprogram period of the program operation, a voltage of the unselect word line (unsel wl) rises from VDD to a first voltage (denoted by V11 in FIG. 3) and then drops to VDD, and a voltage of the select word line also rises from VDD to V11 and then drops to VDD. In addition, a voltage of a select gate line of the top select transistor is VSS, that is, the top select transistor is in an off state; a voltage of a select gate line of the bottom select transistor rises from VSS to a second voltage (denoted by V21 in FIG. 3), that is, the bottom select transistor is in an on state. In addition, a voltage of a source line is a third voltage (denoted by V31 in FIG. 3), that is, the source line is at a high potential. At this time, all the memory cells are on, and the residual electrons in the channel are attracted to the source line. The residual electrons in the channel can be eliminated, thereby reducing the program disturbance. However, the unselect string boosting enhancement method requires a long time, e.g., more than 10 μs, in the program operation, which has a large impact on program.

Examples of the present application provide a memory. In a first period after the application of a last verify voltage (applied to the select word line) of the verify operation ends (e.g., in a first period of the recovery period of the verify operation), the first voltage and the second voltage are applied to a word line coupled with a programmed memory cell in a memory string and to the select word line respectively, wherein the second voltage is greater than the first voltage, so that the voltage on the word line coupled with the programmed memory cell in the memory string drops from the pass voltage to the first voltage, and the voltage on the select word line drops from the last verify voltage of the verify operation to the second voltage. The voltage on the word line coupled with the programmed memory cell in the memory string, and the voltage on the select word line will not be recovered directly to VDD.

Additionally, for the memory provided by the examples of the present application, in a second period after the application of the last verify voltage (applied to the select word line) of the verify operation ends (e.g., in a second period of the recovery period of the verify operation), the third voltage is applied to a first select line coupled with a first select transistor, wherein the third voltage is greater than a threshold voltage of the first select transistor, causing the first select transistor to be in the on state; and VSS is applied to a second select line coupled with a second select transistor, causing the second select transistor to be in the off state. Since the second select transistor starts to be off in the second period, which is later than off time of memory cells coupled with the first word line and the second word line, the potential in the channel thus can be reset better. Further, the voltage on the first select line begins to drop in the second period, so that program disturbance caused by the first select transistor can be reduced. If a top-down program pattern is adopted, the first select transistor is the bottom select transistor, and the second select transistor is the top select transistor. If a bottom-up program pattern is adopted, the first select transistor is the top select transistor, and the second select transistor is the bottom select transistor.

In some examples, the memory comprises a memory cell array, a plurality of word lines, a first select line, and a peripheral circuit. In the first period of the recovery period of the verify operation, the first voltage is applied to the first word line, and the second voltage is applied to the second word line. A memory cell coupled with the first word line is finished programming, a memory cell coupled with the second word line is in a program process currently, and the second word line may be considered as the select word line. In the second period of the recovery period of the verify operation, the third voltage is applied to the first select line, causing the first select transistor to be in the on state. When the voltage on the first word line drops, the residual electrons in the channel may be extracted through the first select transistor that is on, so that residual electrons in the channel can be reduced and the program disturbance can be reduced.

Figure 4:
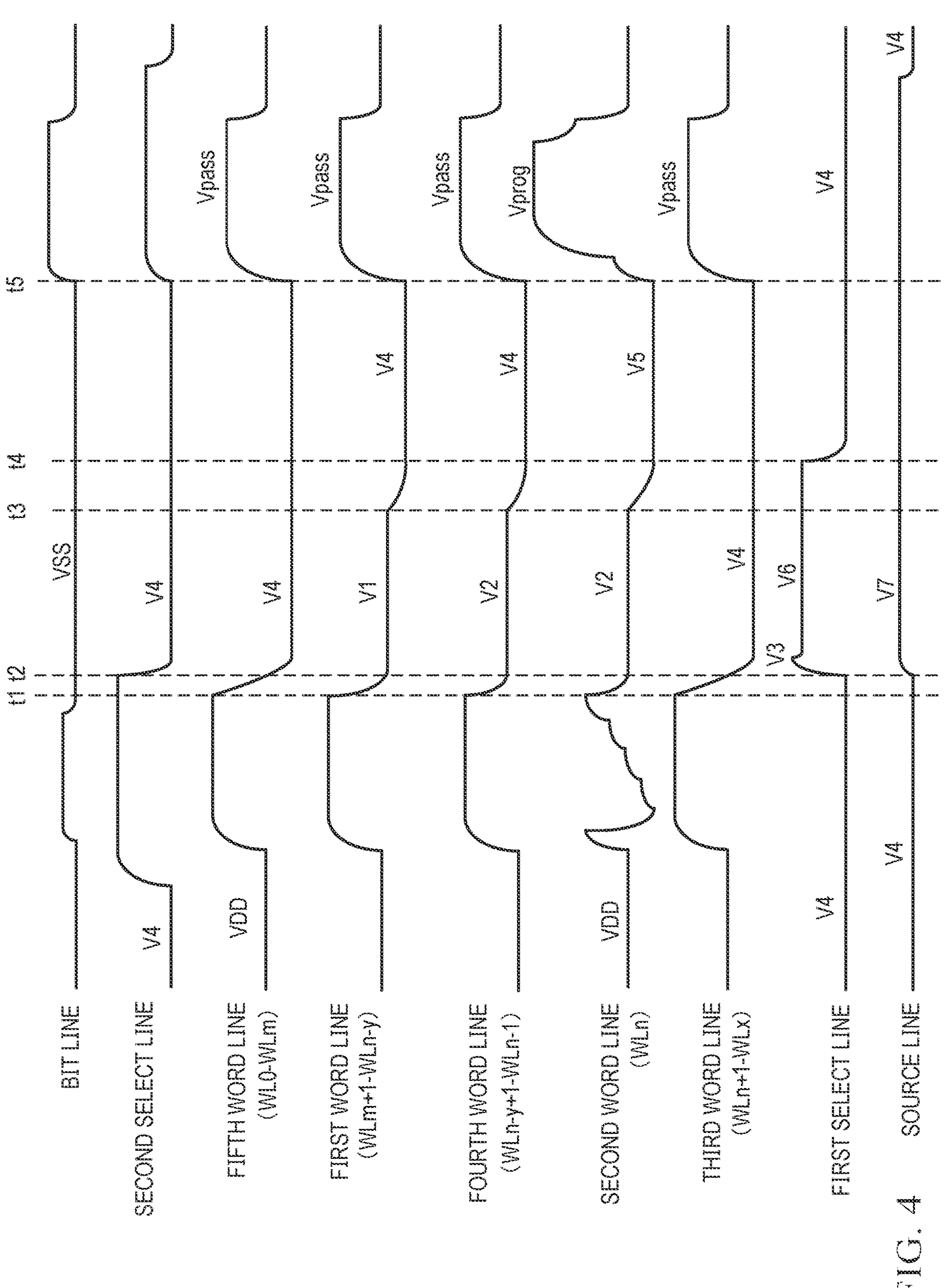
FIG. 4 is a timing diagram of a verify operation and a program operation provided by examples of the present disclosure.

In application to the above memory 101, a timing diagram of the verify operation and the program operation performed in the memory 101 provided by the examples of the present disclosure is described below. Corresponding to the bottom-up program pattern, as shown in FIG. 4, FIG. 4 is a timing diagram of the verify operation and the program operation provided by the examples of the present disclosure. FIG. 4 shows a timing diagram of the bit line, the second select line, a fifth word line, the first word line, a fourth word line, the second word line, a third word line, a first select line, and the source line.

In the first period of the recovery period of the verify operation, the first voltage is applied to the first word line, and the second voltage is applied to the second word line, wherein the second voltage is greater than the first voltage.

In an example, the verify operation may comprise a prior-to-verify pre-pass period, a verify period, and the recovery period; additionally, the program operation may comprise a prior-to-program pre-pass period and a program period. The recovery period of the verify operation is followed by the prior-to-program pre-pass period of the program operation. In the examples of the present disclosure, timings of the peripheral circuit for the recovery period of the verify operation and the prior-to-program pre-pass period of the program operation are adjusted, so as to reduce the program disturbance caused by the HCI effect.

In an example, in the first period of the recovery period of the verify operation, i.e., a period starting at a moment t1 in FIG. 4, the first word line may be the unselect word line, that is, the memory cell coupled with the first word line may be a programmed memory cell. The second word line may be a select word line, that is, the memory performs the program operation and the verify operation on the memory cell coupled with the second word line. The memory cell coupled with the first word line may be understood as a memory cell in a region adjacent to the memory cell coupled with the second word line. When the voltage on the first word line drops, due to the high threshold voltage of the memory cell coupled with the first word line, the HCI effect may occur in the memory cell coupled with the first word line, and there may be residual electrons in the channel, thus causing the program disturbance.

In an example, from the moment t1, the first voltage (denoted by V1 in FIG. 4) is applied to the first word line, so that the voltage on the first word line starts to drop from the pass voltage of the verify period to the first voltage. From the moment t1, the second voltage (denoted by V2 in FIG. 4) is further applied to the second word line, so that the voltage on the second word line starts to drop from the verify voltage of the verify period to the second voltage. In a possible example, the first voltage may range from 2 V to 4 V, and the second voltage may range from 2 V to 5 V, wherein the first voltage and the second voltage should be determined under the condition that the second voltage is greater than the first voltage.

The second voltage is less than the pass voltage. That is, from the moment t1, the voltage on the first word line drops from the pass voltage to the second voltage.

In the second period of the recovery period of the verify operation, the third voltage is applied to the first select line.

In an example, in the second period of the recovery period of the verify operation, i.e., a period starting at a moment t2 in FIG. 4, from the moment t2, the third voltage (denoted by V3 in FIG. 4) is applied to the first select line, so that the voltage on the first select line starts to rise from VSS to the third voltage. The third voltage may be greater than the threshold voltage of the first select transistor, that is, the first select transistor is in the on state.

Further, in the second period, the voltage on the first word line is stabilized at the first voltage, and the voltage on the second word line is stabilized at the second voltage.

As such, since in the first and second periods of the recovery period of the verify operation, the first select transistor is in the on state, and the residual electrons in the channel may be attracted to the source line, thereby reducing the program disturbance caused by the residual electrons.

In an example, with continued reference to FIG. 4, in a third period of the recovery period of the verify operation, a fourth voltage is applied to the first word line, and a fifth voltage is applied to the second word line, wherein the fifth voltage is greater than the fourth voltage.

In an example, in the third period of the recovery period of the verify operation, i.e., a period starting at a moment t3 in FIG. 4, from the moment t3, the fourth voltage (denoted by V4 in FIG. 4) is applied to the first word line, so that the voltage on the first word line drops from the first voltage to the fourth voltage, wherein the fourth voltage may be VSS. Further, the fifth voltage (denoted by V5 in FIG. 4) is applied to the second word line, so that the voltage on the second word line drops from the second voltage to the fifth voltage. Since the fifth voltage is greater than the fourth voltage, when the program voltage is applied to the second word line, a potential difference of the memory cells coupled with the second word line may be reduced, thus reducing a potential difference between adjacent memory cells to weaken a coupling effect.

In an example, with continued reference to FIG. 4, the memory 101 further comprises a second select line coupled to the second select transistor. The peripheral circuit is further configured to: in the second period of the recovery period of the verify operation, apply the fourth voltage to the second select line.

In an example, if the memory 101 adopts the top-down program pattern, the second select transistor is the top select transistor. If the memory 101 adopts the bottom-up program pattern, the second select transistor is the bottom select transistor.

In an example, from the moment t2, the fourth voltage is applied to the second select line, that is, VSS is applied to the second select line, so that the voltage on the second select line drops to VSS, at which time the second select transistor is in the off state. Since the second select transistor starts to be off at the moment t2, which is later than the off time of the memory cells coupled with the first word line or the second word line by Δt=t2−t1, the potential in the channel thus can be reset better.

In an example, with continued reference to FIG. 4, the peripheral circuit is further configured to: after the second period of the recovery period of the verify operation, apply a sixth voltage to the first select line, wherein the sixth voltage is less than the third voltage.

In an example, after the moment t2 and before the moment t3, the sixth voltage (denoted by V6 in FIG. 4) is applied to the first select line, that is, the voltage on the first select line drops from the third voltage to the sixth voltage. Since the sixth voltage is less than the third voltage and the sixth voltage is greater than the pass voltage of the first select transistor, the first select transistor is still in the on state after the moment t2 and before the moment t3. In a possible example, the sixth voltage may be 4 V.

As such, reducing the voltage on the first select line after the moment t2 and before the moment t3 may reduce the program disturbance caused by the first select transistor.

In an example, with continued reference to FIG. 4, the peripheral circuit is further configured to: in a fourth period of the recovery period of the verify operation, apply the fourth voltage to the first select line.

In an example, in the fourth period of the recovery period of the verify operation, i.e., a period starting at a moment t4 in FIG. 4, from the moment t4, the fourth voltage is applied to the first select line, so that the voltage on the first word line drops from the sixth voltage to the fourth voltage. That is, VSS is applied to the first select line, at which time the first select transistor is the off state.

Further, in the fourth period, the voltage on the first word line is stabilized at the fourth voltage, the voltage on the second word line is stabilized at the fifth voltage, and the voltage on the second select line is stabilized at the fourth voltage.

In an example, with continued reference to FIG. 4, the peripheral circuit is further configured to: in a fifth period of the recovery period of the verify operation, apply the program voltage (Vprog) to the second word line, and apply the pass voltage (Vpass) the first word line.

In an example, in the fifth period of the recovery period of the verify operation, i.e., a period starting at a moment t5 in FIG. 4, from the moment t5, the program voltage is applied to the second word line, so that the voltage on the second word line rises from the fifth voltage to the program voltage, producing a large potential difference between the select memory cell and the channel potential, so that electrons are injected into a charge trapping layer through tunneling. The second word line may be programmed using an increment step programming pulse (ISPP) mode, that is, a next program voltage to be applied to the second word line has a certain increment compared with a current program voltage. The pass voltage is applied to the first word line at the moment t5, so that the voltage on the first word line rises from the fourth voltage to the pass voltage, so as to cause the unselect memory cell to be on.

As such, after the moment t5, the memory 101 is in the program period of the program operation, that is, the first to fifth periods of the recovery period of the verify operation may comprise the recovery period of the verify operation and the prior-to-program pre-pass period of the program operation.

In an example, with continued reference to FIG. 4, in the first period of the recovery period of the verify operation, the fourth voltage is applied to the third word line, wherein the third word line is located between the second word line and the first select line. The memory cell coupled with the first word line is the programmed memory cell, and the memory cell coupled with the third word line is an unprogrammed memory cell.

In an example, for the top-down program pattern, the memory cell coupled with the third word line is the unprogrammed memory cell at this time. At the moment t1, the fourth voltage, i.e., VSS, is applied to the third word line, so that the voltage on the third word line drops from the pass voltage to the fourth voltage, at which time the memory cell coupled with the third word line is in the on state, and the residual electrons in the channel can flow to the source line via the memory cell coupled with the third word line and the first select transistor, so that the residual electrons in the channel can be reduced, thereby reducing the program disturbance.

Further, from the second period to the fourth, the voltage on the third word line is stabilized at the fourth voltage.

In an example, with continued reference to FIG. 4, in the second period of the recovery period of the verify operation, a seventh voltage is applied to the source line, wherein the first select line is located between the third word line and the source line.

In an example, if the top-down program pattern is adopted, from the moment t2, the seventh voltage (denoted by V7 in FIG. 4) is applied to the source line, so that the voltage on the source line rises from VSS to the seventh voltage, and stabilized at the seventh voltage from the second period to the fourth period. In a possible example, the seventh voltage may range from 0.4 V to 1 V. As such, from the moment t2, the source line is at a high potential and the residual electrons in the channel will flow to the source line, so that the residual electrons in the channel can be reduced, thereby reducing the program disturbance.

In an example, with continued reference to FIG. 4, in the first period of the recovery period of the verify operation, the second voltage is applied to the fourth word line, wherein the fourth word line is located between the second word line and the first word line.

In an example, the memory cell coupled with the fourth word line is nearest to the memory cell coupled with the second word line. As such, in the first period, the second voltage May be applied to the fourth word line, so that the voltage on the fourth word line drops from the pass voltage to the second voltage, thus reducing the potential difference in the channel. Further, in the second period, the voltage on the fourth word line is stabilized at the second voltage; in the third period, the voltage on the fourth word line drops from the second voltage to the fourth voltage; and in the fourth period, the voltage on the fourth word line is stabilized at the fourth voltage.

In an example, with continued reference to FIG. 4, in the first period of the recovery period of the verify operation, the fourth voltage is applied to the fifth word line, wherein the fifth word line is located between the first word line and the second select line.

In an example, the memory cell coupled with the fifth word line is relatively far away from the memory cell coupled with the second word line, and it may be understood that the memory cell coupled with the fifth word line imposes a small impact on the memory cell that is being programmed. As such, the fourth voltage may be applied to the fifth word line, so that the voltage on the fifth word line drops from the pass voltage to the fourth voltage, and in the second, third, and fourth periods, the voltage on the fifth word line is stabilized at the fourth voltage.

In an example, if the top-down program pattern is adopted, from the first to the fifth period of the recovery period of the verify operation, the fourth voltage may be applied to the bit line, so that the bit line is at a low potential and the source line is at a high potential, then the residual electrons in the channel flow to the source line, so that the residual electrons in the channel can be reduced, thereby reducing the program disturbance.

Figure 5:
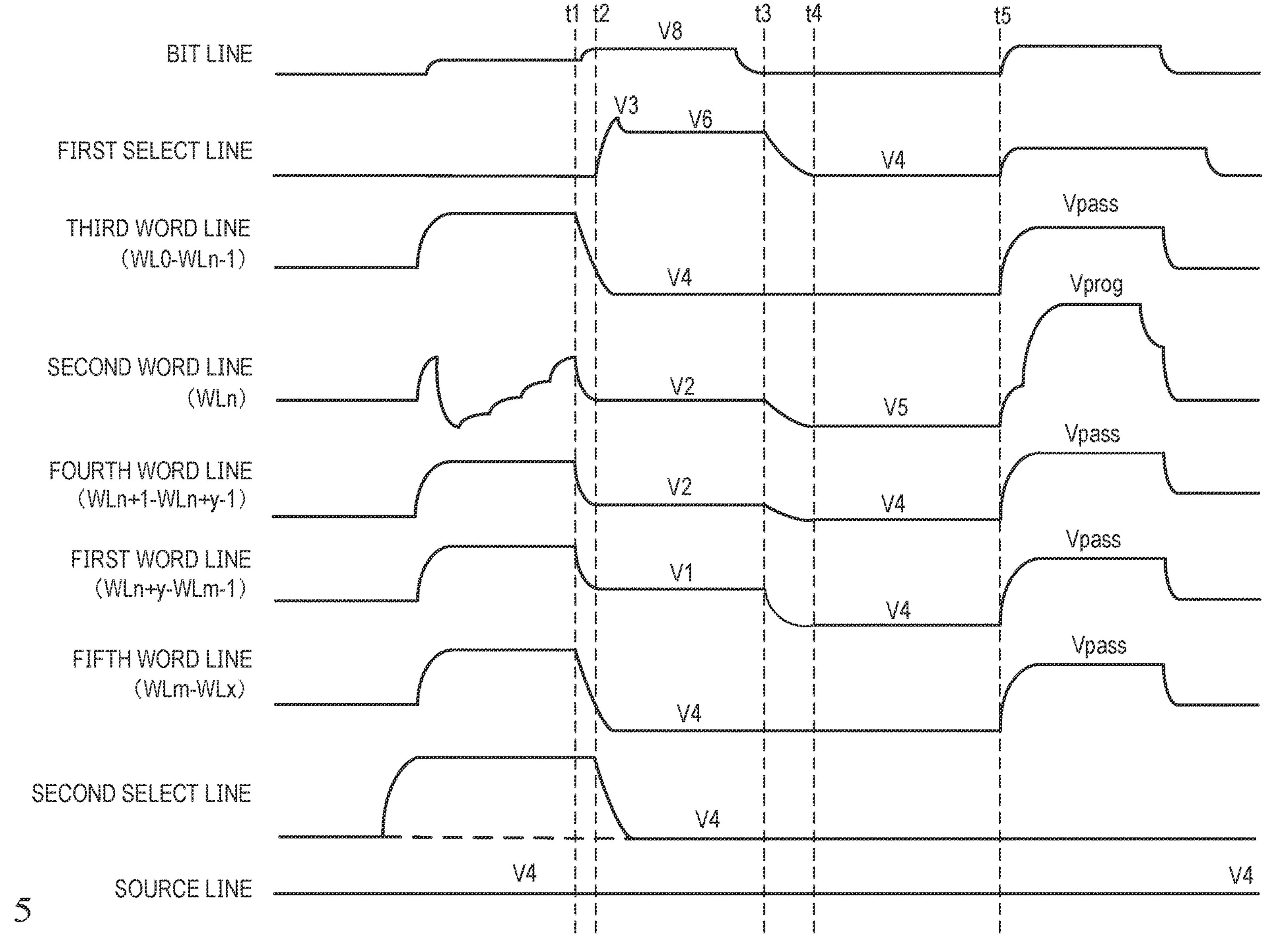
FIG. 5 is a timing diagram of another verify operation and another program operation provided by examples of the present disclosure.

If the bottom-up program pattern is used, as shown in FIG. 5, FIG. 5 is a timing diagram of another verify operation and another program operation provided by the examples of the present disclosure. FIG. 5 shows a timing diagram of the bit line, the first select line, the third word line, the second word line, the fourth word line, the first word line, the fifth word line, the second select line, and the source line respectively.

In an example, in the second period of the recovery period of the verify operation, an eighth voltage is applied to the bit line, wherein the first select line is located between the third word line and the bit line.

In an example, if the bottom-up program pattern is adopted, from the moment t2, the eighth voltage (denoted by V8 in FIG. 5) is applied to the bit line, and in a possible example, the eighth voltage may range from 0.4 V to 1 V. As such, from the moment t2, the bit line is at a high potential, and the residual electrons in the channel will flow to the bit line, so that the residual electrons in the channel can be reduced, thereby reducing the program disturbance.

In an example, if the bottom-up program pattern is adopted, from the first to the fifth period of the recovery period of the verify operation, the fourth voltage may be applied to the source line.

In some examples, along a program direction, all the word lines may be numbered from 0, e.g., WL0 to WLx, wherein x is an integer greater than 0, the word line WLn is the select word line, the memory cells coupled with the word line WL0 to word line WLn−1 are programmed, and the memory cells coupled with the word line WLn+1 to word line WLx are unprogrammed. In the recovery period of the verify operation, the word lines may be grouped, and different voltages may be applied to different groups of word lines. For example, the groups of the word lines may comprise a first group of word lines WL0-WLm, a second group of word lines WLm+1-WLn−y, a third group of word lines WLn− y+1-WLn−1, a select word line WLn, and a fourth group of word lines WLn+1-WLx. In the recovery period of the verify operation, the voltage applied to each of the first group of word lines WL0-WLm may be the same as the voltage applied to the fifth word line in FIG. 4 or FIG. 5; the voltage applied to each of the second group of word lines WLm+1-WLn−y may be the same as the voltage applied to the first word line in FIG. 4 or FIG. 5; the voltage applied to each of the third group of word lines WLn−y+1-WLn−1 may be the same as the voltage applied to the fourth word line in FIG. 4 or FIG. 5; the voltage applied to each of the fourth group of word lines WLn+1-WLx may be the same as the voltage applied to the third word line in FIG. 4 or FIG. 5. In some examples, y may be equal to 5 and m may be set according to actual needs.

In some examples, referring to FIG. 4 or FIG. 5, all the word lines may be numbered in a direction from top (top select transistor) to bottom (bottom select transistor). For example, from WL0 to WLx, WL0 is a top WL, WLx is a bottom WL, and WLn is the select word line. Referring to FIG. 4, if the top-down program pattern is adopted, the groups of the word lines may comprise a first group of word lines WL0-WLm, a second group of word lines WLm+1-WLn−y, a third group of word lines WLn−y+1-WLn−1, a select word line WLn, and a fourth group of word lines WLn+1-WLx. In the recovery period of the verify operation, the voltage applied to each of the first group of word lines WL0-WLm may be the same as the voltage applied to the fifth word line; the voltage applied to each of the second group of word lines WLm+1-WLn−y may be the same as the voltage applied to the first word line; the voltage applied to each of the third group of word lines WLn−y+1 -WLn−1 may be the same as the voltage applied to the fourth word line; the voltage applied to each of the fourth group of word lines WLn+1-WLx may be the same as the voltage applied to the third word line. In some examples, y may be equal to 5 and m may be set according to actual needs.

Referring to FIG. 5, if the bottom-up program pattern is adopted, the groups of the word lines may comprise a first group of word lines WL0-WLn−1, a select word line WLn, a second group of word lines WLn+1-WLn+y−1, a third group of word lines WLn+y-WLm−1, and a fourth group of word lines WLm-WLx. In the recovery period of the verify operation, the voltage applied to each of the first group of word lines WL0-WLn−1 may be the same as the voltage applied to the third word line; the voltage applied to each of the second group of word lines WLn+1-WLn+y−1 may be the same as the voltage applied to the fourth word line; the voltage applied to each of the third group of word lines WLn+y-WLm−1 may be the same as the voltage applied to the first word line; and the voltage applied to each of the fourth group of word lines WLm-WLx may be the same as the voltage applied to the fifth word line. In some examples, y may be equal to 5 and m may be set according to actual needs.

Figure 6:
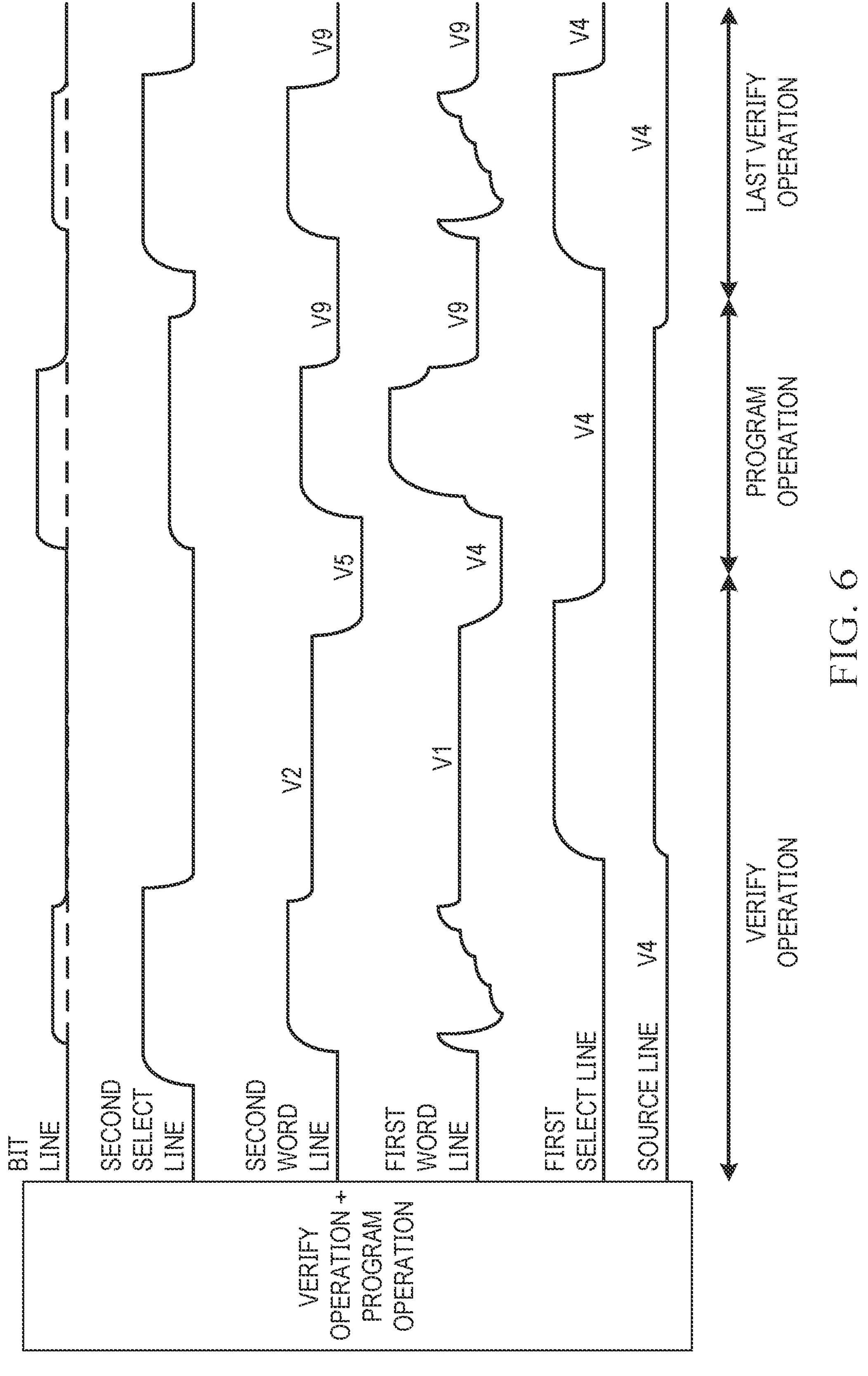
FIG. 6 is a timing diagram of still another verify operation and still another program operation provided by examples of the present disclosure.

In an example, as shown in FIG. 6, FIG. 6 is a timing diagram of still another verify operation and still another program operation provided by examples of the present disclosure. FIG. 6 shows a timing diagram of the bit line, the second select line, the second word line, the first word line, the first select line, and the source line in the verify operation, the program operation, and the last verify operation. In a first period of a recovery period of the last verify operation of the memory string, the ninth voltage is applied to the first word line and the second word line.

In an example, the ninth voltage (denoted by V9 in FIG. 6) may be VDD. That is, voltages on the first word line and the second word line are recovered to VDD in the last verify operation. For successive program and verify operations, in a recovery period of a non-last verify operation, the voltage on the first word line drops from the verify voltage to the first voltage (denoted by V1 in FIG. 6) and then drops to the fourth voltage (denoted by V4 in FIG. 6). The voltage on the second word line drops from the pass voltage to the second voltage (denoted by V2 in FIG. 6) and then drops to the fifth voltage (denoted by V5 in FIG. 6). That is, in the recovery period of the last verify operation, the voltages on the first word line and the second word line drop to the ninth voltage.

Figure 7:
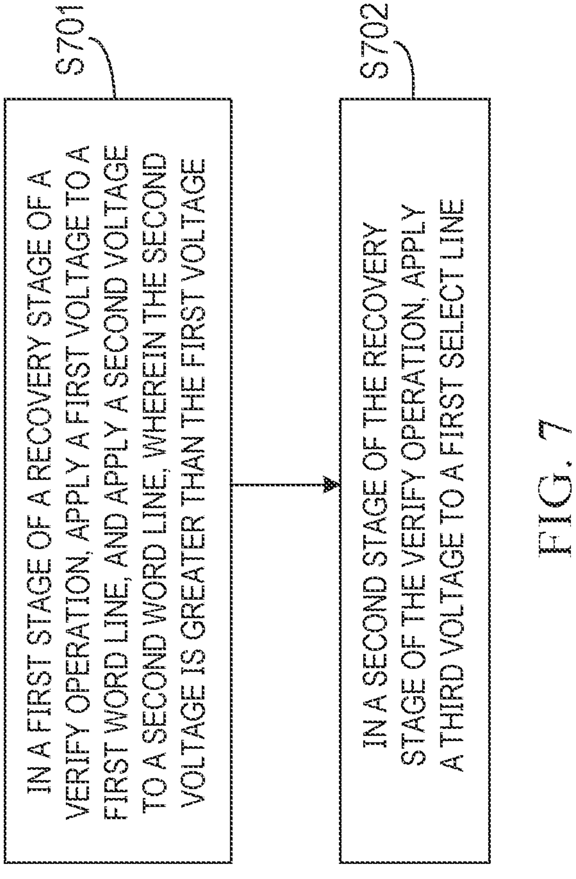
FIG. 7 is a flow diagram of an operation method of a memory provided by examples of the present disclosure.

Applied to the above memory, an operation method of a memory provided by examples of the present disclosure is described below. As shown in FIG. 7, FIG. 7 is a flow diagram of the operation method of a memory provided by the examples of the present disclosure. The method comprises the following process.

S701. In the first period of the recovery period of the verify operation, the first voltage is applied to the first word line, and the second voltage is applied to the second word line, wherein the second voltage is greater than the first voltage.

In an example, the first word line may be an unselect word line, the second word line may be a select word line, and the memory cell coupled with the first word line may be finished programming.

S702. In the second period of the recovery period of the verify operation, the third voltage is applied to the first select line.

In an example, the third voltage may be greater than the threshold voltage of the first select transistor, that is, the first select transistor is in the on state. As such, since in the first and second periods of the recovery period of the verify operation, the first select transistor is in the on state, and the residual electrons in the channel may be attracted to the source line, thereby reducing the program disturbance caused by the residual electrons.

In an example, the method may further comprise: in the third period of the recovery period of the verify operation, applying the fourth voltage to the first word line, and applying the fifth voltage to the second word line, wherein the fifth voltage is greater than the fourth voltage.

In an example, the method may further comprise: in the second period of the recovery period of the verify operation, applying the fourth voltage to the second select line.

In an example, the method may further comprise: after the second period of the recovery period of the verify operation, applying the sixth voltage to the first select line, wherein the sixth voltage is less than the third voltage.

In an example, the method may further comprise: in the fourth period of the recovery period of the verify operation, applying the fourth voltage to the first select line.

In an example, the method may further comprise: in the fifth period of the recovery period of the verify operation, applying the program voltage to the second word line, and applying the pass voltage to the first word line.

In an example, the method may further comprise: in the first period of the recovery period of the verify operation, applying the fourth voltage to the third word line, wherein the third word line is located between the second word line and the first select line.

In an example, the method may further comprise: in the second period of the recovery period of the verify operation, applying the seventh voltage to the source line, wherein the first select line is located between the third word line and the source line.

In an example, the method may further comprise: in the second period of the recovery period of the verify operation, applying the eighth voltage to the bit line, wherein the first select line is located between the third word line and the bit line.

In an example, the method may further comprise: in the first period of the recovery period of the verify operation, applying the second voltage to the fourth word line, wherein the fourth word line is located between the second word line and the first word line.

In an example, the method may further comprise: in the first period of the recovery period of the verify operation, applying the fourth voltage to the fifth word line, wherein the fifth word line is located between the first word line and the second select line.

In an example, the method may further comprise: in the first period of the recovery period of the last verify operation on the memory string, applying the ninth voltage to the first word line and the second word line.

Figure 8:
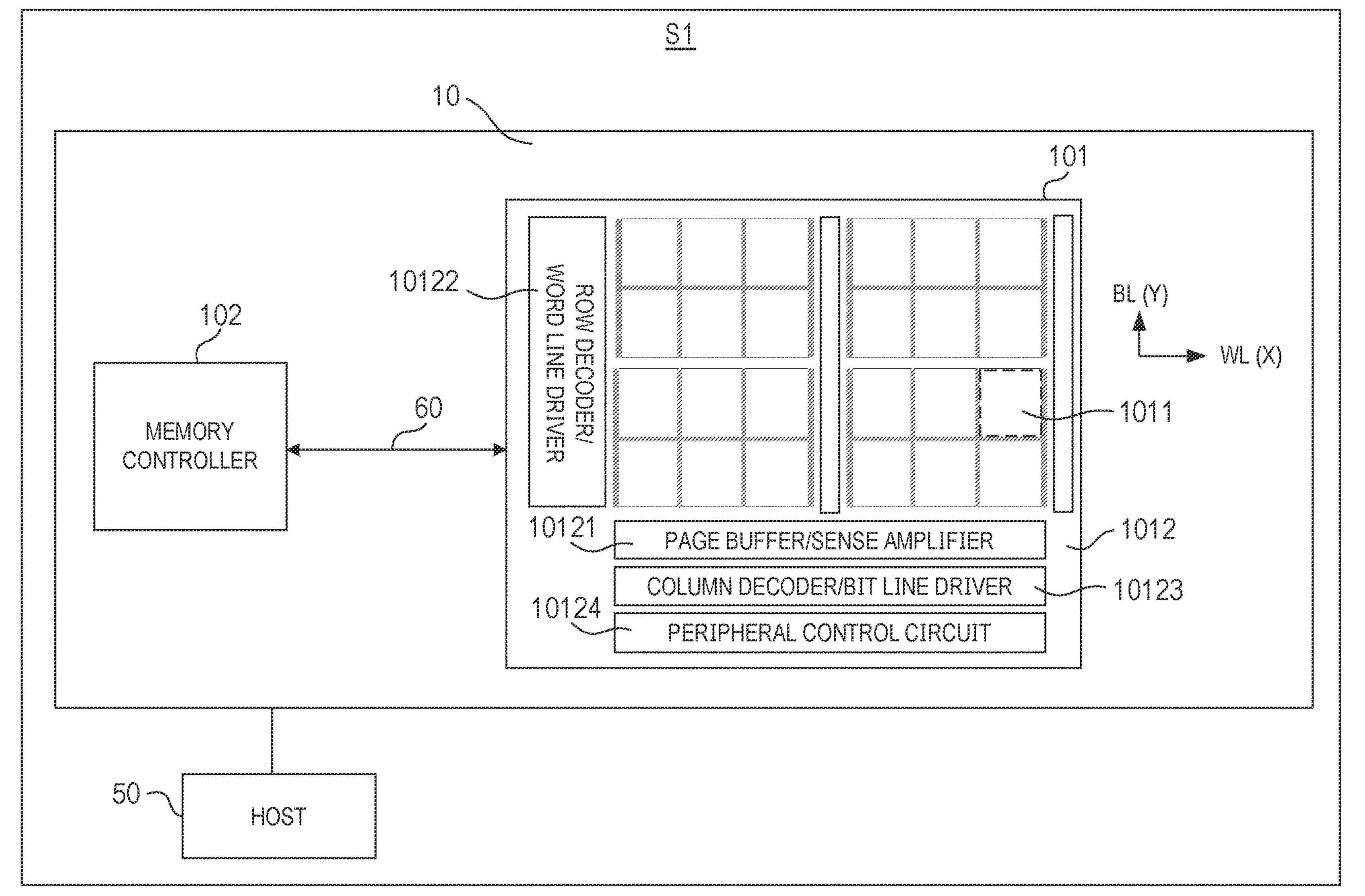
FIG. 8 is a schematic structural diagram of an example system S1 having a memory system 10 provided by examples of the present disclosure.

Examples of the present disclosure further provide a memory system 10. As shown in FIG. 8, FIG. 8 is a schematic structural diagram of an example system S1 having a memory system 10 provided by the examples of the present disclosure. The example system S1 may be a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatuses having storages therein. The memory system 10 (may also be referred to as a NAND memory system) comprises a memory 101 and a memory controller 102. The memory system 10 may communicate with a host 50 through the memory controller 102, wherein the memory controller 102 may be coupled to the memory 101 via a memory channel 60. In some examples, the memory 101 in the present disclosure may be a three-dimensional non-volatile memory, which may be, for example, a NAND flash that may be abbreviated as a flash or NAND. Of course, the memory 101 in the present disclosure may also comprise other memories. The memory system 10 may have more than one memory 101, and each memory 101 may be managed by the memory controller 102.

In some examples, the host 50 may comprise a processor of an electronic apparatus, for example, a central processing unit (CPU), a system-on-chip (SoC), or an application processor (AP). The host 50 may transmit data to be stored at the memory system 10 or read data stored at the memory system 10.

The memory controller 102 may process an input/output (I/O) request received from the host 50 to guarantee data integrity and effective storage, and may also manage the memory 101. The memory channel 60 may provide data via a data bus and control communications between the memory controller 102 and the memory 101.

With continued reference to FIG. 8, the memory 101 may be a memory chip (package), a memory die or any part of the memory die, and may comprise a plurality of memory blocks 1011. The memory block 1011 may be of a megabyte (MB) size, and the memory block 1011 may be a minimum unit of carrying out an erase operation. Each memory block 1011 may comprise a plurality of memory cells, wherein each memory cell may be addressed by, for example, a bit line 41 and a word line 43. The bit line 41 and the word line 43 may be arranged vertically (for example, in a row and a column respectively), thereby forming an array of metal lines. Directions of the bit line and the word line are labeled as “BL” and “WL” respectively in FIG. 8. In the present disclosure, the one or more memory blocks 1011 may be also referred to as a “memory array” or an “array”. The memory array is a core region in a memory apparatus, and performs a storage function.

The memory 101 further comprises a peripheral circuit region 1012. The peripheral circuit region 1012 (also referred to as a peripheral circuit) contains many digital, analog and/or hybrid-signal circuits (for example, the page buffer/sense amplifier 10121, the row decoder/word line driver 10122, the column decoder/bit line driver 10123 and the peripheral control circuit 10124) to support functions of the memory 101. The peripheral control circuit 10124 may comprise a register and an active and/or passive semiconductor apparatus, such as a transistor, a diode, a capacitor, a resistor or the like, which is obvious to those of ordinary skills in the field. The peripheral control circuit 10124 of the peripheral circuit region 1012 may be configured to initiate a program operation on a select memory cell of the NAND memory string in the memory block 1011. In some implementations, the peripheral control circuit 10124 receives a program command from the memory controller 102 through an interface and, as a response, transmits control signals to the row decoder/word line driver 10122, the column decoder/bit line driver 10123, and the voltage generator (not shown in FIG. 8) that are disposed in the peripheral circuit region 1012, so as to initiate the program operation on the select memory cell.

A layout of electronic devices in the memory system 10 and the memory 101 in FIG. 8 is shown as an example. The memory system 10 and the memory 101 may have other layouts and may comprise additional devices. For example, the memory 101 may further comprise a high voltage charge pump, and an input-output circuit, etc. The memory system 10 may further comprise firmware, and a data scrambler, etc. In some examples, the peripheral circuit region 1012 and the memory array may be formed separately on separate wafers and connected with each other by wafer bonding.

Figure 10:
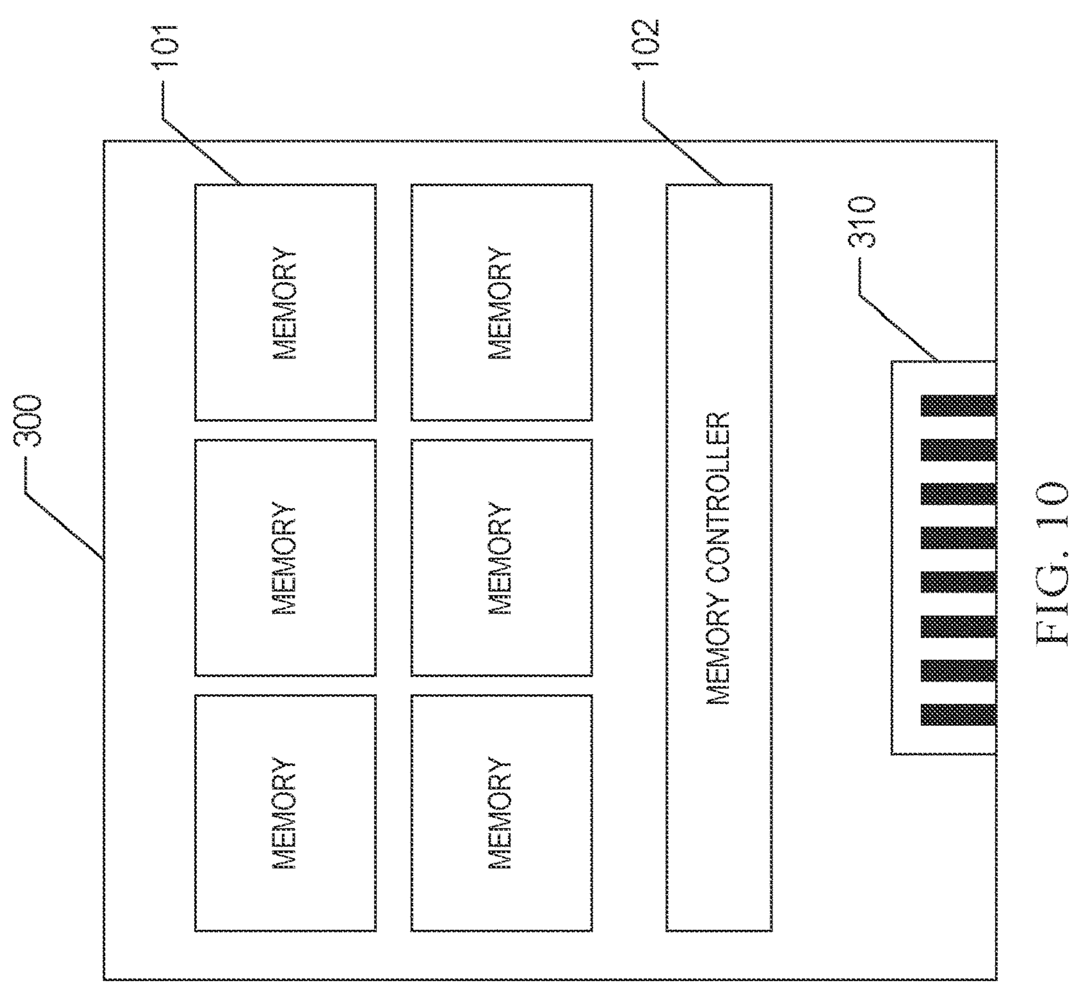
FIG. 10 is a schematic diagram of another memory card provided by examples of the present disclosure.
Figure 9:
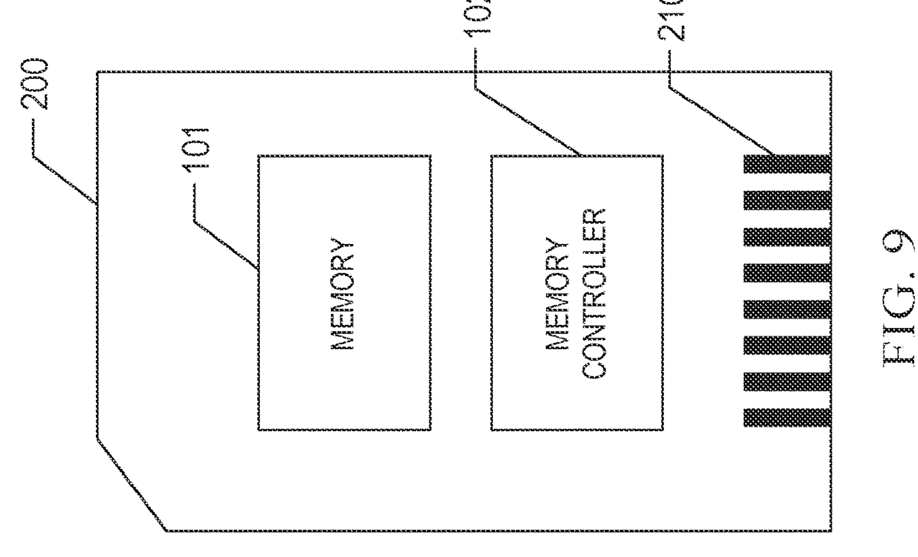
FIG. 9 is a schematic diagram of a memory card provided by examples of the present disclosure.

The memory controller 102 and one or more memories 101 may be integrated into various types of memory apparatuses, for example, included in the same package, such as a Universal Flash Storage (UFS) package or an Embedded Multi Media Card (eMMC) package. That is, the memory system 10 may be implemented and packaged into different types of end electronic products. In one example as shown in FIG. 9, the memory controller 102 and a single memory 101 may be integrated into a memory card 200. The memory card 200 may comprise a Personal Computer Memory Card International Association (PCMCIA), a Compact Flash (CF) card, a Smart Media (SM) card, a memory stick, a Multimedia Card (MMC), a Secure Digital Memory Card (SD card), or a UFS, etc. The memory card 200 may further comprise a memory card connector 210 that couples the memory card 200 with the host 50. In another example as shown in FIG. 10, the memory controller 102 and a plurality of memories 101 may be integrated into a solid state drive (SSD) 300. The SSD 300 may further comprise an SSD connector 310 coupling the SSD 300 with the host 50.

Some examples of the present disclosure further provide an electronic apparatus. The electronic apparatus may be any one of a cellphone, a desktop computer, a tablet computer, a notebook computer, a server, a vehicle-mounted apparatus, a wearable apparatus (e.g., a smart watch, a smart bracelet, and smart glasses, etc.), a mobile supply, a gaming machine, and a digital multimedia player, etc.

The electronic apparatus may comprise the memory system as described above, and may further comprise at least one of a Central Processing Unit (CPU) and a cache, etc.

The above descriptions are merely example implementations of the present disclosure, and the protection scope of the present disclosure is not limited thereto. Any variation or replacement that may be readily figured out by those skilled in the technical field within the technical scope disclosed by the present disclosure shall be encompassed within the protection scope of the present disclosure. Therefore, the scope of protection of the present disclosure should be defined by the scope of protection of the claims.

What is claimed is:

1. A memory, comprising:

a memory cell array comprising memory strings, each of the memory strings comprising a first select transistor, memory cells, and a second select transistor sequentially connected in series;

word lines coupled to the memory cells;

a first select line coupled to the first select transistor; and a peripheral circuit coupled to the word lines and the first select line, and configured to:

in a verify period of a verify operation, apply a verify voltage to a selected word line;

in a first period of a recovery period of the verify operation, apply a first voltage to a first word line, and apply a second voltage to a second word line, wherein the second voltage is greater than the first voltage, and wherein the first voltage and the second voltage are both less than a pass voltage applied during a program operation; and in a second period of the recovery period of the verify operation, apply a third voltage to the first select line, wherein the third voltage is greater than a threshold voltage of the first select transistor to transition the first select transistor to an on state.

2. The memory of claim 1, wherein the peripheral circuit is further configured to:

in a third period of the recovery period of the verify operation, apply a fourth voltage to the first word line, and apply a fifth voltage to the second word line, wherein the fifth voltage is greater than the fourth voltage.

3. The memory of claim 1, further comprising a second select line coupled to the second select transistor, wherein the peripheral circuit is further configured to:

in the second period of the recovery period of the verify operation, apply a fourth voltage to the second select line.

4. The memory of claim 3, wherein the peripheral circuit is further configured to:

after the second period of the recovery period of the verify operation, apply a sixth voltage to the first select line, wherein the sixth voltage is less than the third voltage.

5. The memory of claim 4, wherein the peripheral circuit is further configured to:

in a fourth period of the recovery period of the verify operation, apply the fourth voltage to the first select line.

6. The memory of claim 5, wherein the peripheral circuit is further configured to:

in a fifth period of the recovery period of the verify operation, apply a program voltage to the second word line, and apply a pass voltage to the first word line.

7. The memory of claim 1, wherein the peripheral circuit is further configured to:

in the first period of the recovery period of the verify operation, apply a fourth voltage to a third word line, wherein the third word line is located between the second word line and the first select line.

8. The memory of claim 7, wherein a memory cell coupled with the first word line is a programmed memory cell, and a memory cell coupled with the third word line is an unprogrammed memory cell.

9. The memory of claim 8, wherein the peripheral circuit is further configured to:

in the second period of the recovery period of the verify operation, apply a seventh voltage to a source line, wherein the first select line is located between the third word line and the source line.

10. The memory of claim 8, wherein the peripheral circuit is further configured to:

in the second period of the recovery period of the verify operation, apply an eighth voltage to a bit line, wherein the first select line is located between the third word line and the bit line.

11. The memory of claim 1, wherein the peripheral circuit is further configured to:

in the first period of the recovery period of the verify operation, apply the second voltage to a fourth word line, wherein the fourth word line is located between the second word line and the first word line.

12. The memory of claim 1, wherein the peripheral circuit is further configured to:

in the first period of the recovery period of the verify operation, apply a fourth voltage to a fifth word line, wherein the fifth word line is located between the first word line and a second select line.

13. The memory of claim 1, wherein the peripheral circuit is further configured to:

in a first period of a recovery period of a last verify operation on the memory string, apply a ninth voltage to the first word line and the second word line.

14. The memory of claim 1, wherein the second voltage is less than a pass voltage.

15. A method of operating a memory, comprising:

in a verify period of a verify operation, apply a verify voltage to a selected word line;

in a first period of a recovery period of the verify operation, applying a first voltage to a first word line, and applying a second voltage to a second word line, wherein the second voltage is greater than the first voltage, and wherein the first voltage and the second voltage are both less than a pass voltage applied during a program operation; and in a second period of the recovery period of the verify operation, applying a third voltage to a first select line, wherein the third voltage is greater than a threshold voltage of a first select transistor to transition the first select transistor to an on state.

16. The method of claim 15, further comprising:

in a third period of the recovery period of the verify operation, applying a fourth voltage to the first word line, and applying a fifth voltage to the second word line, wherein the fifth voltage is greater than the fourth voltage.

17. The method of claim 15, further comprising:

in the second period of the recovery period of the verify operation, applying a fourth voltage to a second select line.

18. The method of claim 17, further comprising:

after the second period of the recovery period of the verify operation, applying a sixth voltage to the first select line, wherein the sixth voltage is less than the third voltage.

19. The method of claim 18, further comprising:

in a fourth period of the recovery period of the verify operation, applying the fourth voltage to the first select line.

20. A memory system, comprising:

one or more memories, comprising:

a memory cell array comprising memory strings, each of the memory strings comprising a first select transistor, memory cells, and a second select transistor sequentially connected in series;

word lines coupled to the memory cells;

a first select line coupled to the first select transistor; and a peripheral circuit coupled to the word lines and the first select line, and configured to:

in a verify period of a verify operation, apply a verify voltage to a selected word line;

in a first period of a recovery period of the verify operation, apply a first voltage to a first word line, and apply a second voltage to a second word line, wherein the second voltage is greater than the first voltage, and wherein the first voltage and the second voltage are both less than a pass voltage applied during a program operation; and in a second period of the recovery period of the verify operation, apply a third voltage to the first select line, wherein the third voltage is greater than a threshold voltage of the first select transistor to transition the first select transistor to an on state; and a memory controller coupled to the one or more memories and configured to control the one or more memories.

* * * * *